US010276562B2

(12) United States Patent
Wang et al.

(10) Patent No.: US 10,276,562 B2
(45) Date of Patent: Apr. 30, 2019

(54) SEMICONDUCTOR DEVICE WITH MULTIPLE THRESHOLD VOLTAGE AND METHOD OF FABRICATING THE SAME

(71) Applicant: Taiwan Semiconductor Manufacturing Company Limited, Hsinchu (TW)

(72) Inventors: Li-Ting Wang, Hsinchu (TW); Teng-Chun Tsai, Hsinchu (TW); Cheng-Tung Lin, Hsinchu County (TW); De-Fang Chen, Hsinchu (TW); Hui-Cheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/148,825

(22) Filed: Jan. 7, 2014

(65) Prior Publication Data
US 2015/0194423 A1  Jul. 9, 2015

(51) Int. Cl.
*H01L 27/088* (2006.01)
*H01L 29/78* (2006.01)
(Continued)

(52) U.S. Cl.
CPC ...... *H01L 27/088* (2013.01); *H01L 21/26586* (2013.01); *H01L 21/823412* (2013.01);
(Continued)

(58) Field of Classification Search
CPC ......... H01L 29/66909; H01L 29/66477; H01L 29/66484; H01L 21/823443;
(Continued)

(56) References Cited

U.S. PATENT DOCUMENTS

| 6,087,248 A * | 7/2000 | Rodder ............. H01L 21/28044 257/E21.198 |
| 2002/0084493 A1* | 7/2002 | Marshall ............... G11C 11/412 257/369 |

(Continued)

FOREIGN PATENT DOCUMENTS

| CN | 102024813 A | 4/2011 |
| CN | 102280479 | 12/2011 |

OTHER PUBLICATIONS

Korean Office Action; Application No. 10-2014-0176030; dated Aug. 24, 2016.
(Continued)

*Primary Examiner* — Kyle R Quigley
(74) *Attorney, Agent, or Firm* — McDermott Will & Emery LLP

(57) ABSTRACT

According to an exemplary embodiment, a chip is provided. The chip includes a first vertical device having a first threshold and second vertical device having a second threshold. The first vertical device includes a first source; a first channel over the first source; a first drain over the first channel; a first conductive layer adjacent to the first channel; and a first gate adjacent to the first conductive layer. The second vertical device includes a second source; a second channel over the second source; a second drain over the second channel; a second conductive layer adjacent to the second channel; and a second gate adjacent to the second conductive layer.

17 Claims, 19 Drawing Sheets

(51) Int. Cl.
*H01L 21/8234* (2006.01)
*H01L 21/265* (2006.01)
*H01L 29/423* (2006.01)
*H01L 29/66* (2006.01)

(52) U.S. Cl.
CPC ........... *H01L 21/823418* (2013.01); *H01L 21/823437* (2013.01); *H01L 21/823487* (2013.01); *H01L 29/42392* (2013.01); *H01L 29/66666* (2013.01); *H01L 29/7827* (2013.01)

(58) Field of Classification Search
CPC ........... H01L 29/7827; H01L 27/088; H01L 29/66666; H01L 21/823462
USPC ........................................................ 257/329
See application file for complete search history.

(56) References Cited

U.S. PATENT DOCUMENTS

| | | | | |
|---|---|---|---|---|
| 2005/0282326 | A1* | 12/2005 | Gilmer | H01L 21/823842 438/199 |
| 2006/0001162 | A1* | 1/2006 | Schutz | H01L 21/28052 257/754 |
| 2006/0006476 | A1* | 1/2006 | Biery | H01L 21/823425 257/382 |
| 2007/0184627 | A1 | 8/2007 | Cho et al. | |
| 2007/0212896 | A1* | 9/2007 | Olsen | H01J 37/32082 438/758 |
| 2007/0298599 | A1* | 12/2007 | Jang et al. | 438/585 |
| 2009/0134465 | A1 | 5/2009 | Shimizu | |
| 2010/0059807 | A1* | 3/2010 | Cho et al. | 257/306 |
| 2011/0086477 | A1 | 4/2011 | Ohuchi | |
| 2011/0169074 | A1* | 7/2011 | Lee | 257/329 |
| 2011/0175152 | A1* | 7/2011 | Booth, Jr. | H01L 21/845 257/306 |
| 2011/0187407 | A1* | 8/2011 | Iyer | G01R 31/02 326/37 |
| 2011/0233688 | A1* | 9/2011 | Ren | H01L 21/84 257/408 |
| 2011/0299325 | A1* | 12/2011 | Kim | 365/156 |
| 2011/0303985 | A1 | 12/2011 | Masuoka et al. | |
| 2012/0108017 | A1* | 5/2012 | Greene | H01L 21/823462 438/154 |
| 2012/0132912 | A1* | 5/2012 | Suekawa | H01L 29/45 257/49 |
| 2013/0062673 | A1 | 3/2013 | Masuoka et al. | |
| 2013/0240996 | A1 | 9/2013 | Yin et al. | |
| 2013/0299771 | A1* | 11/2013 | Youn | H01L 21/845 257/9 |
| 2014/0334230 | A1* | 11/2014 | Kwon, II | 365/185.11 |

OTHER PUBLICATIONS

Taiwan Office Action; Application No. 103146023; dated Sep. 6, 2016.
German Office Action; Application No. 102014119174.9; dated Feb. 23, 2017.
Chinese Office Action; Application No. 201410403876.0; dated Apr. 6, 2017.
Office Action issued in Chinese Patent Application No. 201410403876.0, dated Dec. 22, 2017.
Singanamalla, R., et al., "Effective Work function Modulation by As Implantation in Metal Gate Stacks", The Electrochemical Society, ECS Transactions, 2(1) 49-60 (2006).
Fet, A., "Flurine implantation for effective work function control in p-type metal-oxide-semiconductor high-k metal gate stacks", American Vacuum Society, J. Vac. Sci. Technol. B 29(1), Jan./Feb. 2011.
Chen Y.W., "Effective Work Function Modulation by Aluminum Ion Implantation on Hf-Based High-k/Metal Gate pMOSFET", IEEE Electron Device Letters, vol. 31, No. 11, Nov. 2010.

* cited by examiner

1300

1300

1300

1400

1400

1500

SEMICONDUCTOR DEVICE WITH MULTIPLE THRESHOLD VOLTAGE AND METHOD OF FABRICATING THE SAME

FIELD

This disclosure relates generally to semiconductors, and, more particularly, to a semiconductor device with multiple threshold voltage and a method of fabricating the same.

BACKGROUND

In the advanced technology, integration of various functions into a single chip may shrink the dimension of the chip and enhance the performance. Since various functions require multiple thresholds, there is a need for a semiconductor device with multiple threshold voltages.

DETAILED DESCRIPTION

Reference will now be made in detail to exemplary embodiments, which are illustrated in the accompanying drawings. Wherever possible, the same reference numbers will be used throughout the drawings to refer to the same or like parts.

The disclosure describes a method which may utilize a forming process and an implanting process to fabricate vertical devices having multiple thresholds and is suitable for different functions. The forming process may refer to deposition processes, photolithography processes, etching processes or the combination thereof.

Figure 1:
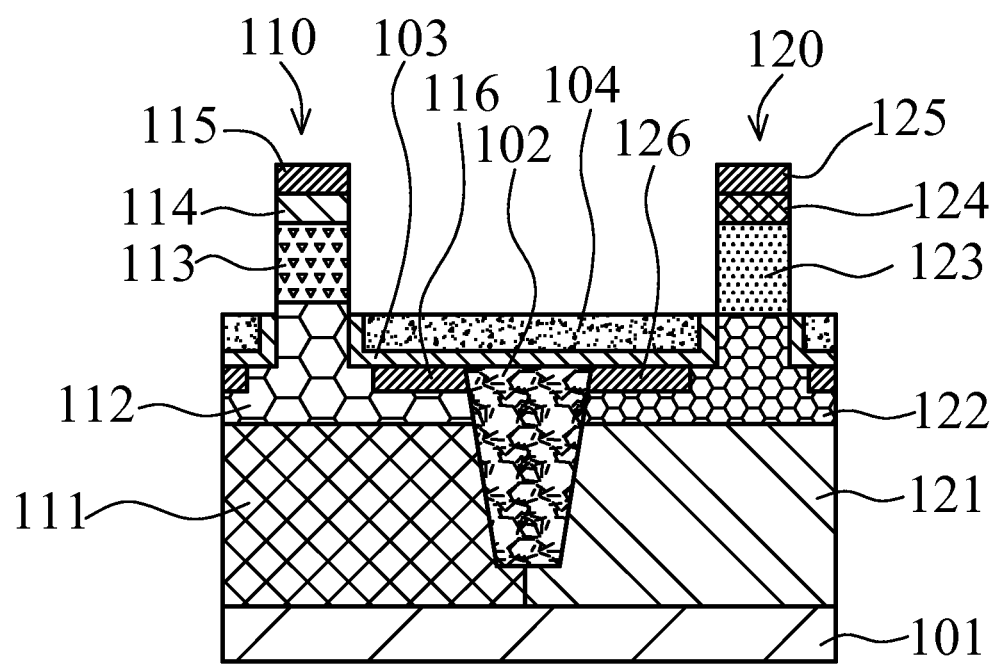
FIG. 1 is a sectional view illustrating an exemplary semiconductor device according to an exemplary embodiment.

FIG. 1 is a sectional view illustrating an exemplary semiconductor device according to an exemplary embodiment. As shown in FIG. 1, a chip 100 is provided. In the chip 100, a first vertical device 110 having a first threshold and a second vertical device 120 having a second threshold are provided over a substrate 101. The first vertical device 110 and the second vertical device 120 may be vertical-gate-all-around devices electrically isolated by a shallow trench isolation 102. The first vertical device 110 may be a PMOS, and may include an n-well 111, a first source 112, a first channel 113 and a first drain 114. The second vertical device 120 may be a NMOS, and may include a p-well 121, a second source 122, a second channel 123 and a second drain 124. Salicides 115, 116, 125, 126 are used to reduce contact resistance. The threshold may refer to the value of the gate-source voltage when the conducting channel just begins to connect the source and drain of the transistor, allowing significant current.

The first source 112 may be disposed over the n-well 111. The first channel 113 may be disposed over the first source 112. The first drain 114 may be disposed over the first channel 113. The second source 122 may be disposed over the p-well 121. The second channel 123 may be disposed over the second source 122. The second drain 124 may be disposed over the second channel 123. A silicon nitride layer 103 as an insulator may be disposed over the first source 112, the second source 122 and the shallow trench isolation 102. An oxide layer 104 may be disposed over the silicon nitride layer 103.

Figure 2:
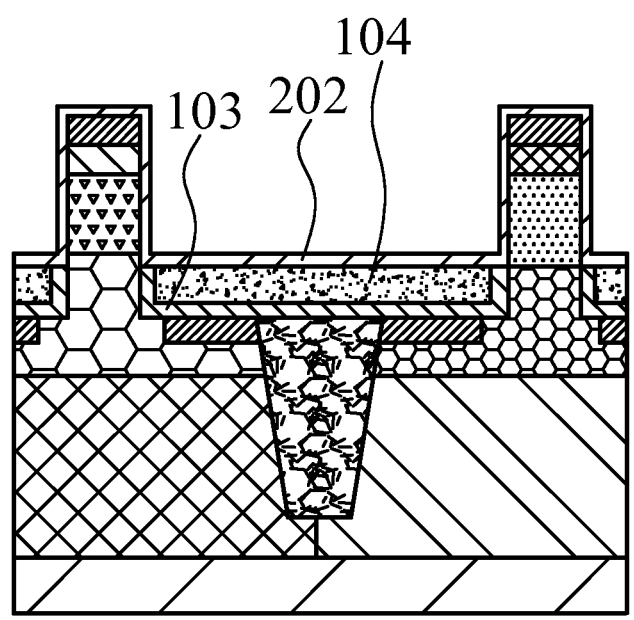
FIG. 2 is a sectional view illustrating the exemplary chip according to the exemplary embodiment.

FIG. 2 is a sectional view illustrating the exemplary chip according to the exemplary embodiment. As shown in FIG. 2, a high-k dielectric layer 202 may be formed over a portion of the silicon nitride layer 103 and the oxide layer 104. In another exemplary embodiment, an interfacial layer (not shown) may be formed over a portion of the silicon nitride layer 103 and the oxide layer 104. Then, the high-k dielectric layer 202 may be formed over the interfacial layer (not shown).

Figure 3:
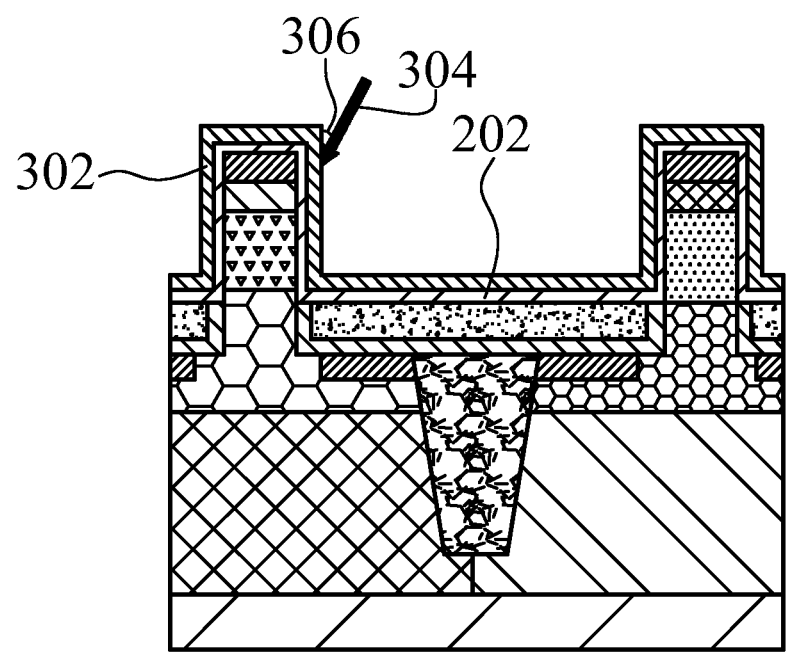
FIG. 3 is a sectional view illustrating the exemplary chip according to the exemplary embodiment.

FIG. 3 is a sectional view illustrating the exemplary chip according to the exemplary embodiment. As shown in FIG. 3, a first conductive layer 302 may be formed over the high-k dielectric layer 202 as a portion of a first gate electrode. The first conductive layer 302 may be formed of, for example, a p-type work function metal. The p-type work function metal may be formed of, for example, compounds of TiN, or TaN based material with Te, Re Rh, Be, or Co. The thickness of the p-type work function metal may be 5-100 angstrom.

In the exemplary embodiment, the first conductive layer 302 may be further implanted with a first dopant 304 at a tilted angle 306 with reference to vertical direction. In detail, the tilted angle 306 with reference to vertical direction for implantation may be about 5 to 60 degrees. The first dopant 304 may be formed of, for example, Al, Ga, In, Be, Se, or F. Typical implantation energies may be, for example, in the range of 100 eV to 25 keV. Efficient dosage may be, for example, in the range of 10 ions/cm$^2$ to $10^{16}$ ions/cm$^2$.

Figure 4:
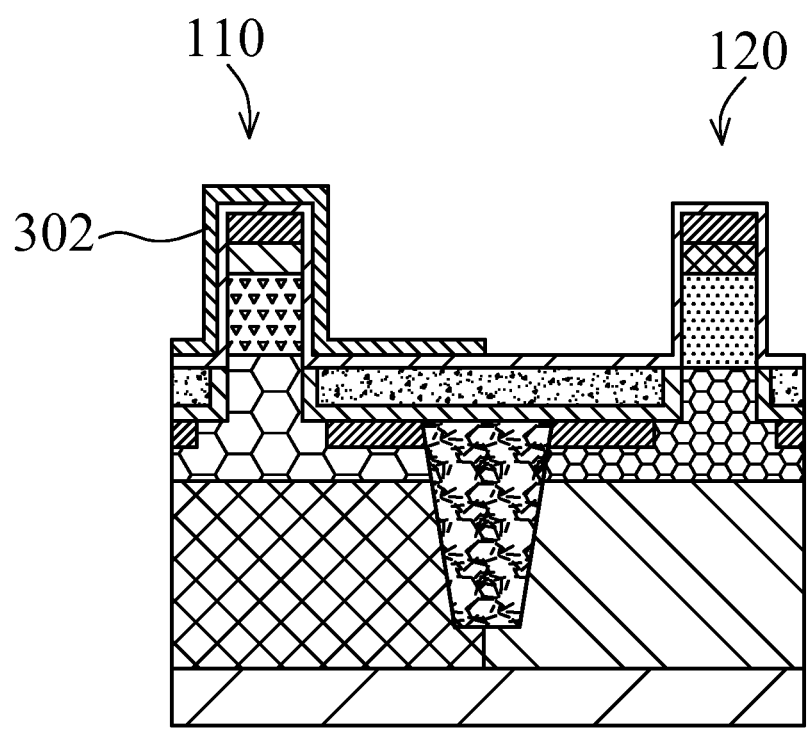
FIG. 4 is a sectional view illustrating the exemplary chip according to the exemplary embodiment.

FIG. 4 is a sectional view illustrating the exemplary chip according to the exemplary embodiment. As shown in FIG. 4, the portion of the first conductive layer 302 corresponding to the second vertical device 120 is removed, and the portion of the first conductive layer 302 corresponding to the first vertical device 110 remains.

Figure 5:
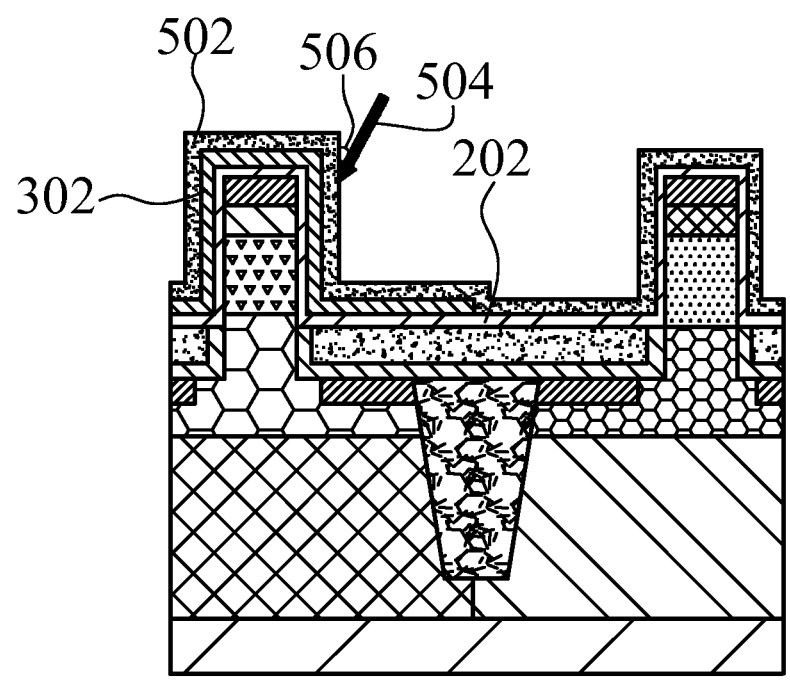
FIG. 5 is a sectional view illustrating the exemplary chip according to the exemplary embodiment.

FIG. 5 is a sectional view illustrating the exemplary chip according to the exemplary embodiment. As shown in FIG. 5, a second conductive layer 502 may be formed over the first conductive layer 302 and a portion of the high-k dielectric layer 202 as a portion of a second gate electrode. The second conductive layer 502 may be formed of, for example, an n-type work function metal. The n-type work function metal may be formed of, for example, compounds of TiN, TiAl, or TaN based material with Al, Mn, Zr, Ph, or Sn. The thickness of the n-type work function metal may be 5-300 angstrom. In another exemplary embodiment, a third conductive layer may be formed over the second conductive layer 502. The lateral surface, of the channel 113 of the first vertical device 110.

In the exemplary embodiment, the second conductive layer 502 may be further implanted with a second dopant 504 at a tilted angle 506 with reference to vertical direction. In detail, the tilted angle 506 with reference to vertical direction for implantation may be about 5 to 60 degrees. The second dopant 504 may be formed of, for example, As, Sb, P, Ta, Te, Sn, S, Mo, Cs, or Ge. Typical implantation energies may be, for example, in the range of 100 eV to 25 keV, Efficient dosage may be, for example, in the range of $10^{13}$ ions/cm$^2$ to $10^{16}$ ions/cm$^2$.

Figure 6:
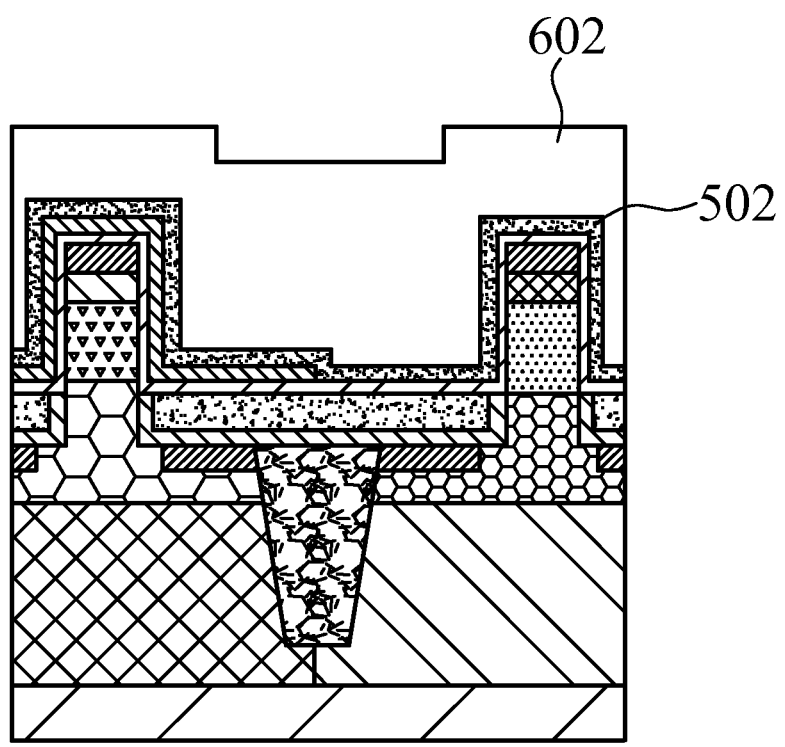
FIG. 6 is a sectional view illustrating the exemplary chip according to the exemplary embodiment.

FIG. 6 is a sectional view illustrating the exemplary chip according to the exemplary embodiment. As shown in FIG. 6, a gate layer 602 may be formed over the second conductive layer 502 by deposition. The gate layer 602 may be formed of, for example, Al, W, Co or Cu.

Figure 7:
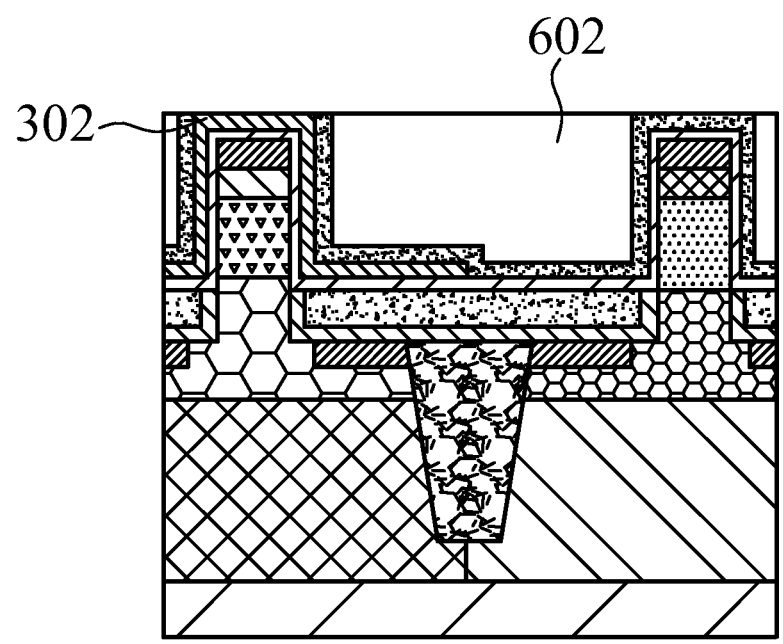
FIG. 7 is a sectional view illustrating the exemplary chip according to the exemplary embodiment.

FIG. 7 is a sectional view illustrating the exemplary chip according to the exemplary embodiment. As shown in FIG. 7, a chemical mechanical polishing is performed on the gate layer 602 and stops on the first conductive layer 302.

Figure 8:
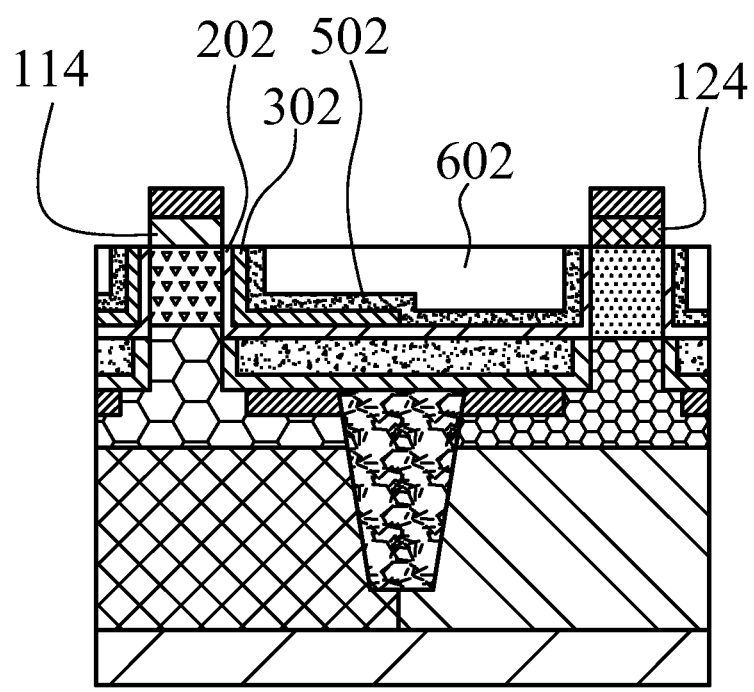
FIG. 8 is a sectional view illustrating the exemplary chip according to the exemplary embodiment.

FIG. 8 is a sectional view illustrating the exemplary chip according to the exemplary embodiment. As shown in FIG. 8, a dry etch back process is performed on the gate layer 602, high-k dielectric layer 202, the first conductive layer 302 and the second conductive layer 502 to expose the first drain 114 and the second drain 124.

Figure 9:
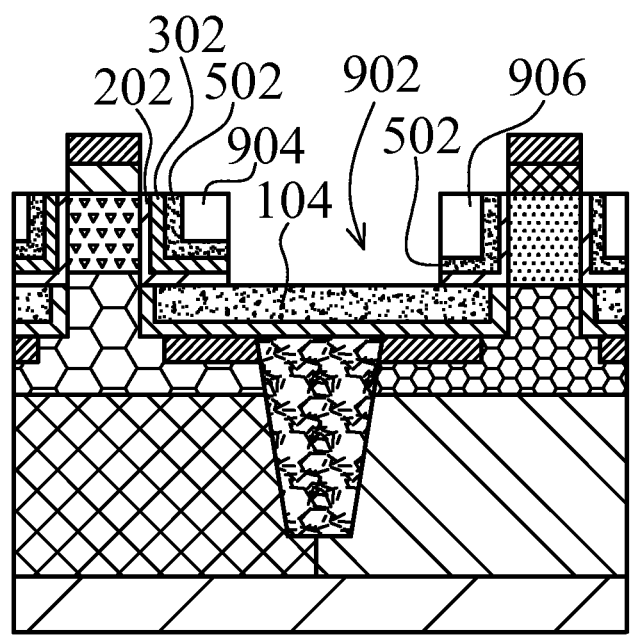
FIG. 9 is a sectional view illustrating the exemplary chip according to the exemplary embodiment.

FIG. 9 is a sectional view illustrating the exemplary chip according to the exemplary embodiment. As shown in FIG. 9, a dry etch back process is performed on the gate layer (not shown), high-k dielectric layer 202, the first conductive layer 302 and the second conductive layer 502 to expose a portion of the oxide layer 104 and to form a gap 902. A first gate metal 904 is formed adjacent to the first conductive layer 302 and the second conductive layer 502, and a second gate metal 906 is formed adjacent to the second conductive layer 502.

Figure 10:
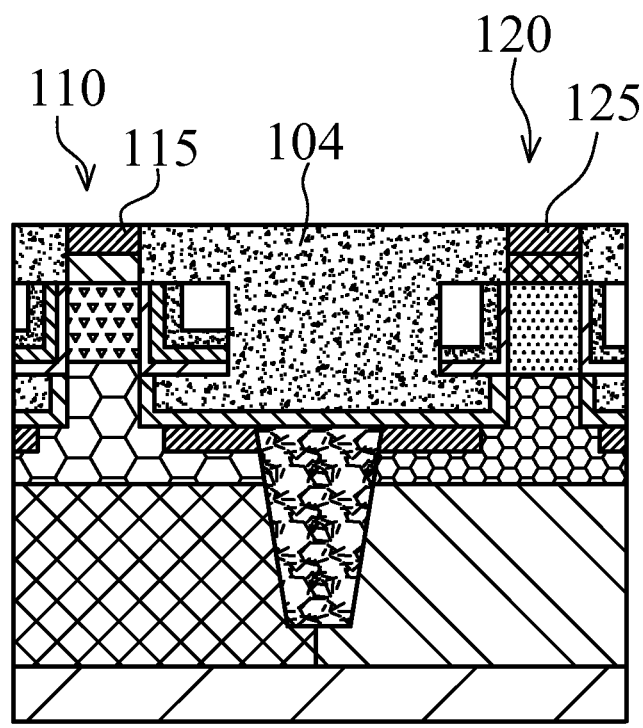
FIG. 10 is a sectional view illustrating the exemplary chip according to the exemplary embodiment.

FIG. 10 is a sectional view illustrating the exemplary chip according to the exemplary embodiment. As shown in FIG. 10, the oxide layer 104 may be re-formed over the first vertical device 110 and the second vertical device 120. And a chemical mechanical polishing is performed on the oxide layer 104 and stops on the salicides 115, 125.

As such, in the chip 100, the first vertical device 110 having the first threshold and the second vertical device 120 having the second threshold are formed. The first conductive layer 302 and the second conductive layer 502 of the first vertical device 110 corresponds to the first threshold, and the second conductive layer 502 of the second vertical device 120 corresponds to the second threshold.

Figure 11:
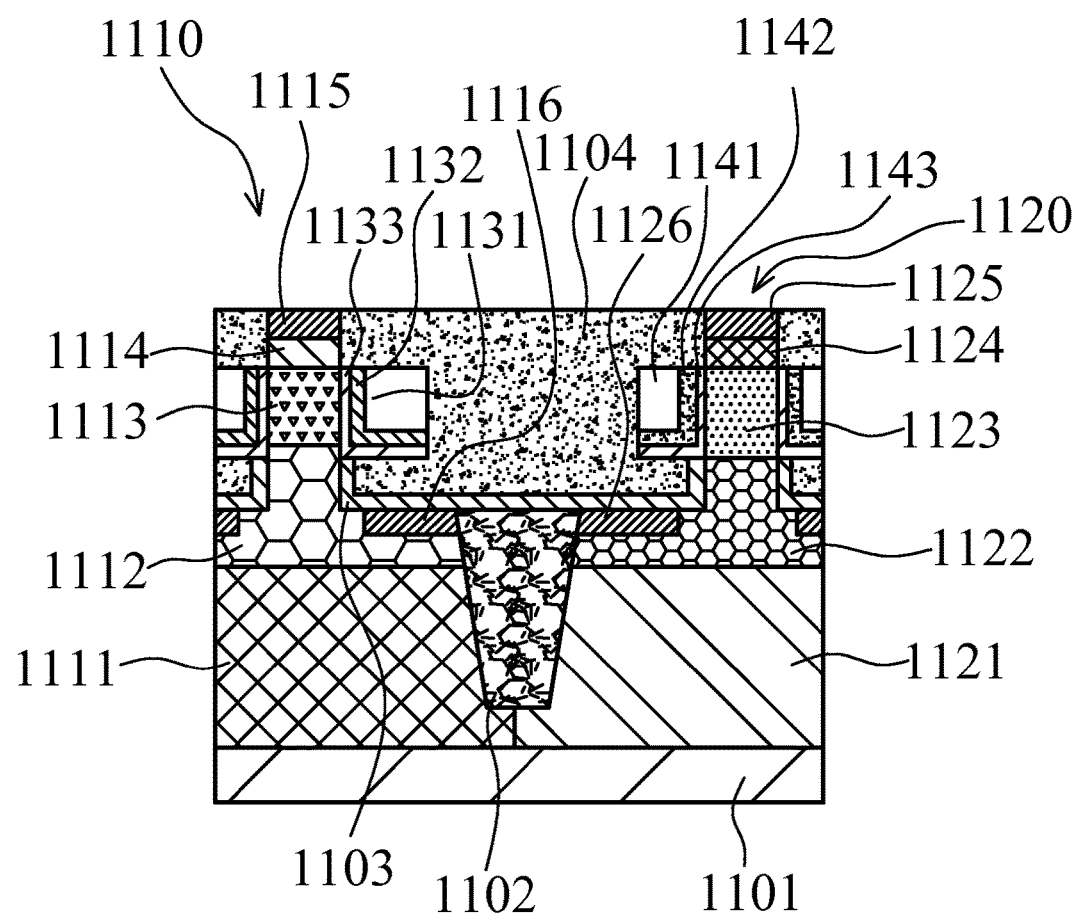
FIG. 11 is a sectional view illustrating an exemplary semiconductor device according to an exemplary embodiment.

FIG. 11 is a sectional view illustrating an exemplary semiconductor device according to an exemplary embodiment. As shown in FIG. 11, a chip 1100 is provided. In the chip 1100, a first vertical device 1110 having a first threshold and a second vertical device 1120 having a second threshold are provided over a substrate 1101. The first vertical device 1110 and the second vertical device 1120 may be electrically isolated by a shallow trench isolation 1102. The first vertical device 1110 may be a PMOS, and may include a n-well 1111, a first source 1112, a first channel 1113, a first drain 1114, a first gate metal 1131, a first conductive layer 1132 and a first high-k dielectric layer 1133. The second vertical device 1120 may be a NMOS and may include a p-well 1121, a second source 1122, a second channel 1123, a second drain 1124, a second gate metal 1141, a second conductive layer 1142 and a second high-k dielectric layer 1143. Salicides 1115, 1116, 1125, 1126 are used to reduce contact resistance. The threshold may refer to the value of the gate-source voltage when the conducting channel just begins to connect the source and drain of the transistor, allowing significant current.

The first source 1112 may be disposed over the n-well 1111. The first channel 1113 may be disposed over the first source 1112. The first drain 1114 may be disposed over the first channel 1113. The second source 1122 may be disposed over the p-well 1121. The second channel 1123 may be disposed over the second source 1122. The second drain 1124 may be disposed over the second channel 1123. A silicon nitride layer 1103 as an insulator may be disposed over the first source 1112, the second source 1122 and the shallow trench isolation 1102. An oxide layer 1104 may be disposed over the silicon nitride layer 1103.

The first conductive layer 1132 is disposed adjacent to the first channel 1113, and the second conductive layer 1142 is disposed adjacent to the second channel 1123. The first high-k dielectric layer 1133 may be disposed between the first conductive layer 1132 and the first channel 1113, and the second high-k dielectric layer 1143 may be disposed between the second conductive layer 1142 and the second channel 1123. The first gate metal 1131 is disposed adjacent to the first conductive layer 1132, and the second gate metal 1141 is disposed adjacent to the second conductive layer 1142.

In an exemplary embodiment, the first conductive layer 1132 and the second conductive layer 1142 may be formed of a first material, the first conductive layer 1132 is implanted with a first dopant, and the second conductive layer 1142 is implanted with a second dopant. The first dopant may be formed of, for example, Al, Ga, In, Be, Se, or F. The second dopant may be formed of, for example, As, Sb, P, Ta, Te, Sn, S, Mo, Cs, or Ge. Typical implantation energies may be, for example, in the range of 100 eV to 25 keV. Efficient dosage may be, for example, in the range of $10^{13}$ ions/cm$^2$ to $10^{16}$ ions/cm$^2$.

In an exemplary embodiment, the first conductive layer 1132 and the second conductive layer 1142 may be formed of a first material, the first conductive layer 1132 is implanted with a first dopant with a first concentration, and the second conductive layer 1142 is implanted with the first dopant with a second concentration. In an exemplary embodiment, the first conductive layer 1132 and the second conductive layer 1142 may be formed of a first material, the first conductive layer has a first thickness, and the second conductive layer has a second thickness. In an exemplary embodiment, the first conductive layer 1132 is formed of a first material having a first work function, and the second conductive layer 1142 is formed of a second material having a second work function. In the above exemplary embodiments, the first conductive layer 1132 corresponds to the first threshold, and the second conductive layer 1142 corresponds to the second threshold.

In another exemplary embodiment, the first vertical device may further include a third conductive layer (not shown) between the first gate metal 1131 and the first conductive layer 1132. The first conductive layer and the third conductive layer correspond to the first threshold, and the second conductive layer corresponds to the second threshold.

Figure 12:
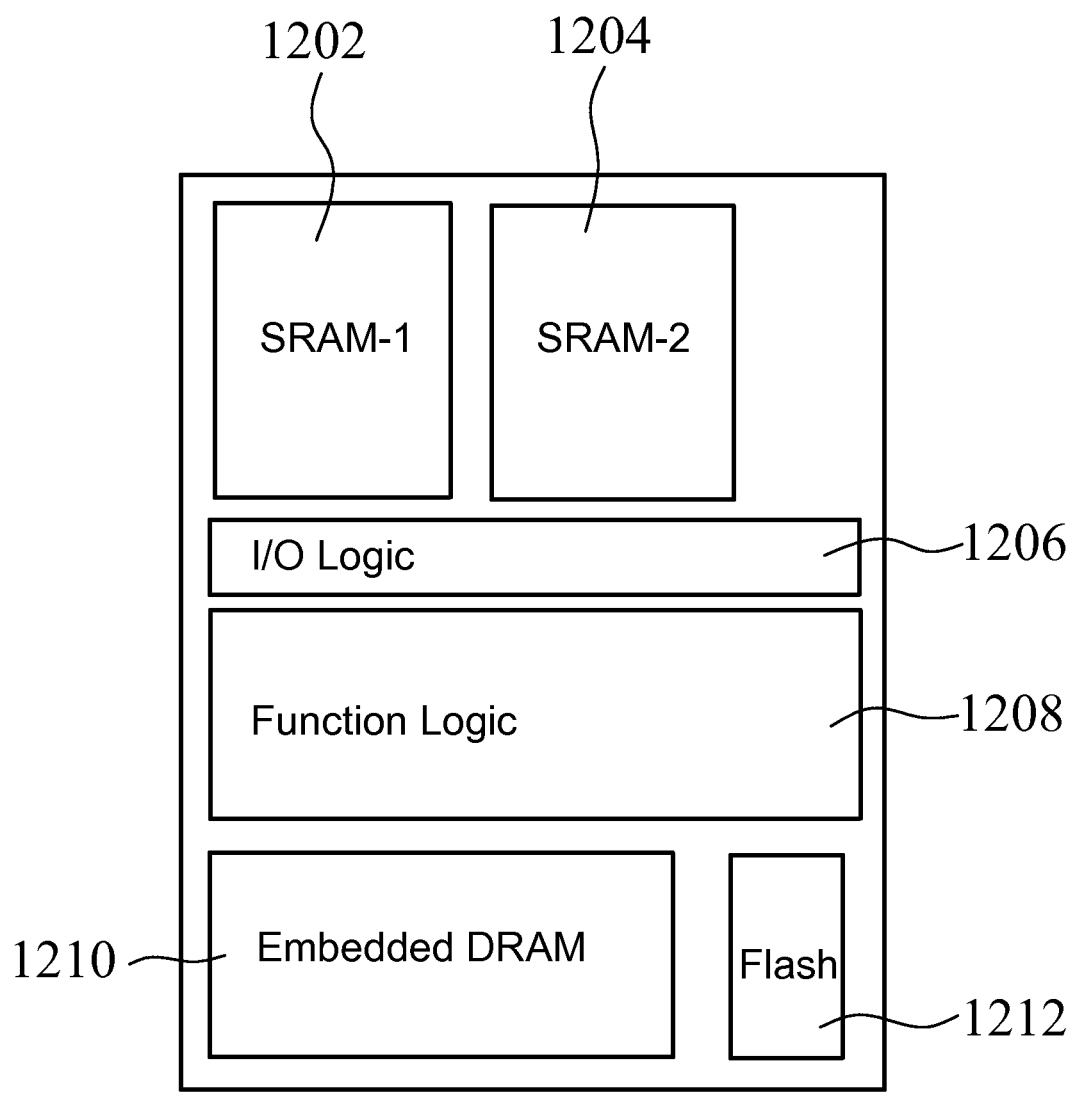
FIG. 12 is a block diagram illustrating an exemplary chip according to an exemplary embodiment.

FIG. 12 is a block diagram illustrating an exemplary chip according to an exemplary embodiment. As shown in FIG. 12, a chip 1200 is provided. The chip 1200 includes a first SRAM block 1202, a second SRAM block 1204, an I/O logic block 1206, a function logic block 1208, an embedded DRAM block 1210 and a flash block 1212. Said first vertical device and said second vertical device in the disclosure may be used for at least one of the blocks 1202-1212.

FIGS. 13a-13h are block diagrams illustrating an exemplary chip according to an exemplary embodiment. A chip 1300 is provided. Transistors 1301-1306 are vertical devices to be manufactured to have six different thresholds. For example, the transistors 1301-1303 are respectively NFETs having a low threshold, a medium threshold and a high threshold. For example, 1304-1306 are respectively PFETs having a low threshold, a medium threshold and a high threshold.

Figure 13A:
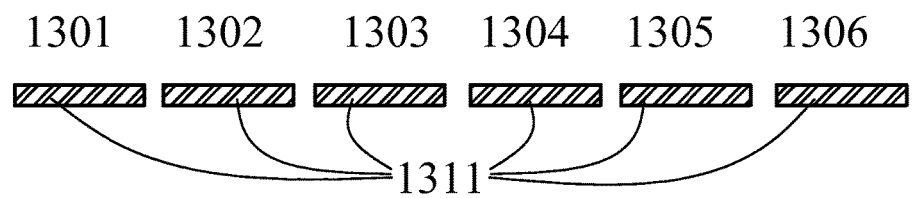
FIGS. 13a-13h are block diagrams illustrating an exemplary chip according to an exemplary embodiment.
Figure 13B:
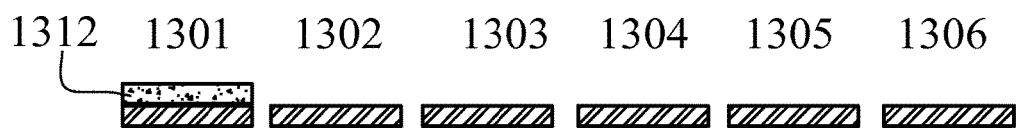
Figure 13C:
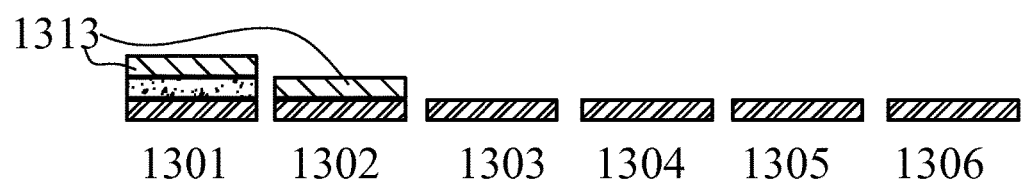
Figure 13D:
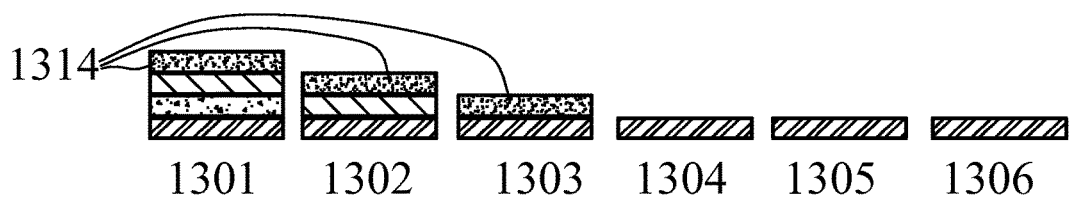
Figure 13E:
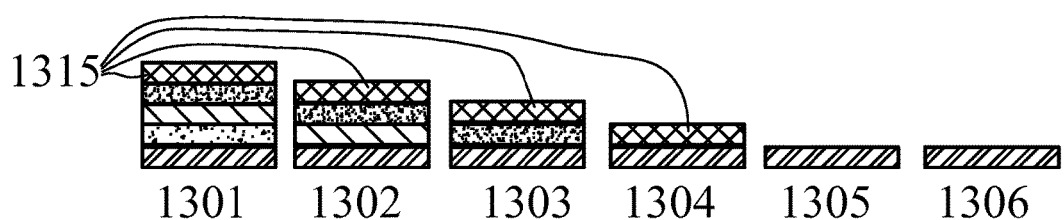
Figure 13F:
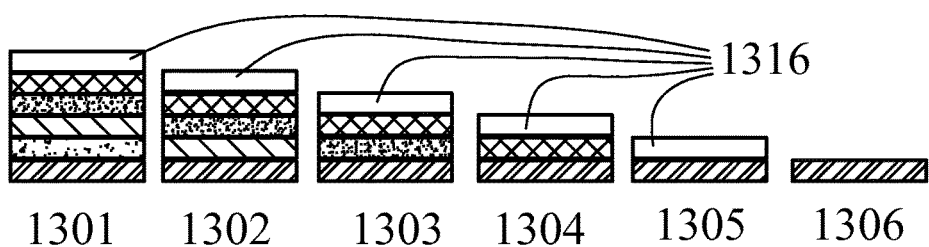
Figure 13G:
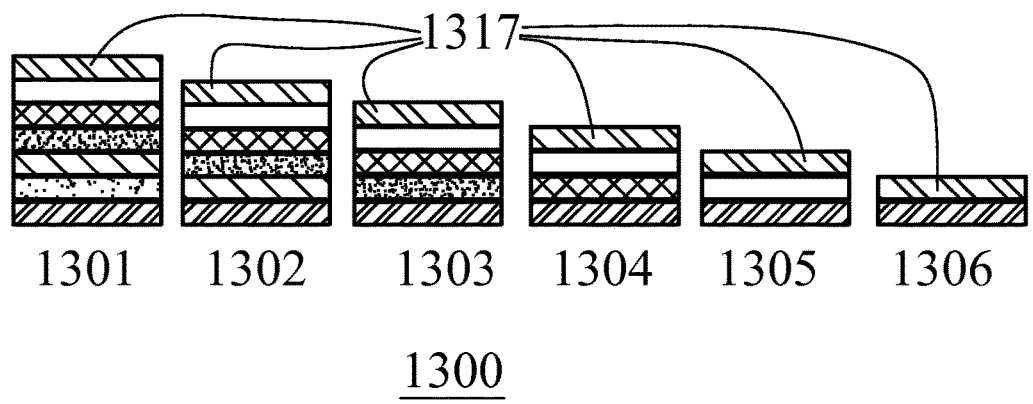
Figure 13H:
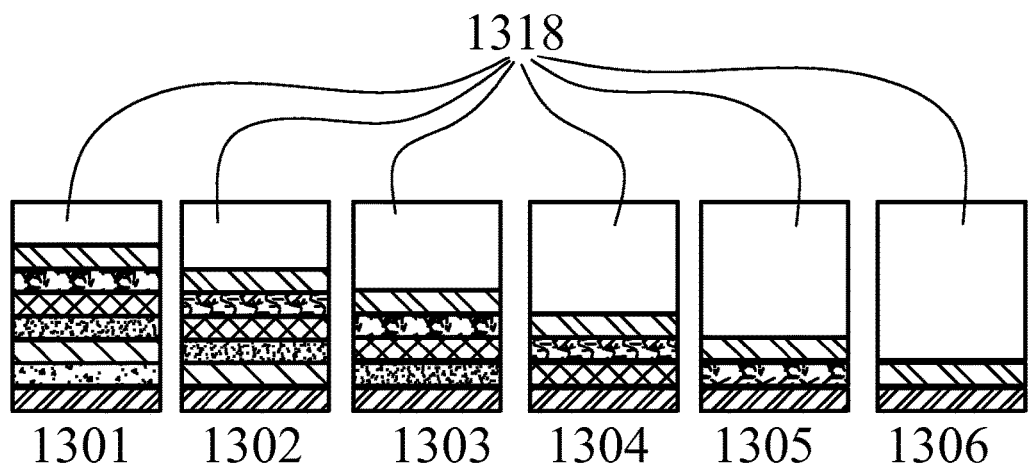

In FIG. 13a, for the transistors 1301-1306, a first p-type metal layer 1311 is formed over a channel layer (not shown). In FIG. 13b, for the transistor 1301, a first n-type metal layer 1312 is formed. In FIG. 13c, for the transistors 1301-1302, a second n-type metal layer 1313 is formed. In FIG. 13d, for the transistors 1301-1303, a third n-type metal layer 1314 is formed. In FIG. 13e, for the transistors 1301-1304, a second p-type metal layer 1315 is formed. In FIG. 13f, for the transistors 1301-1305, a third p-type metal layer 1316 is formed. In FIG. 13g, for the transistors 1301-1306, a cap metal layer 1316 is formed. In FIG. 13h, for the transistors 1301-1306, a gate metal layer 1318 is formed. As such, the transistors 1301-1306 having six different thresholds are provided.

FIGS. 14a-14h are block diagrams illustrating an exemplary chip according to an exemplary embodiment. A chip 1400 is provided. Transistors 1401-1406 are vertical devices to be manufactured to have six different thresholds. For example, the transistors 1401-1403 are respectively NFETs having a low threshold, a medium threshold and a high threshold. For example, 1404-1406 are respectively PFETs having a low threshold, a medium threshold and a high threshold.

Figure 14A:
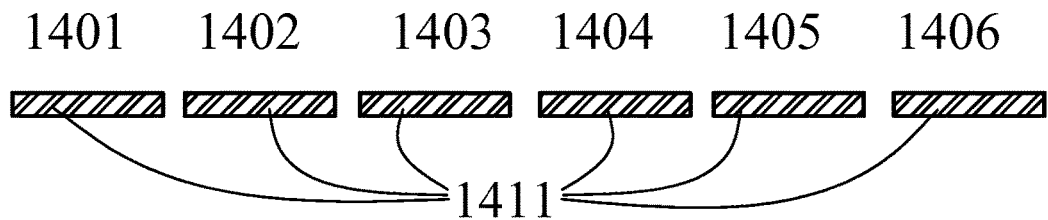
FIGS. 14a-14h are block diagrams illustrating an exemplary chip according to an exemplary embodiment.
Figure 14B:
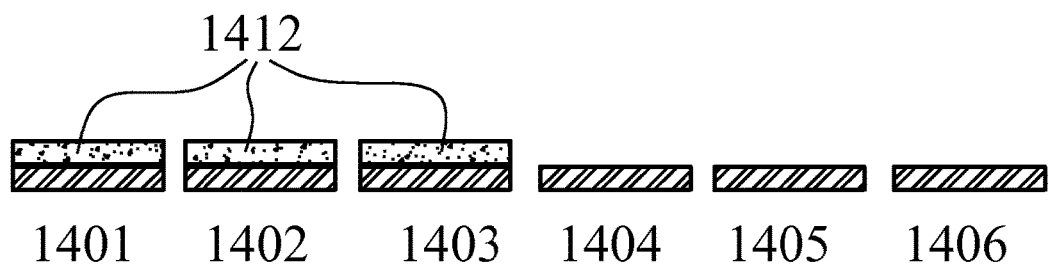
Figure 14C:
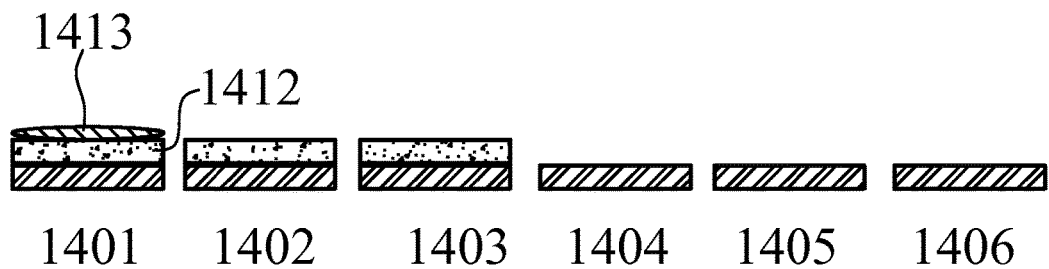
Figure 14D:
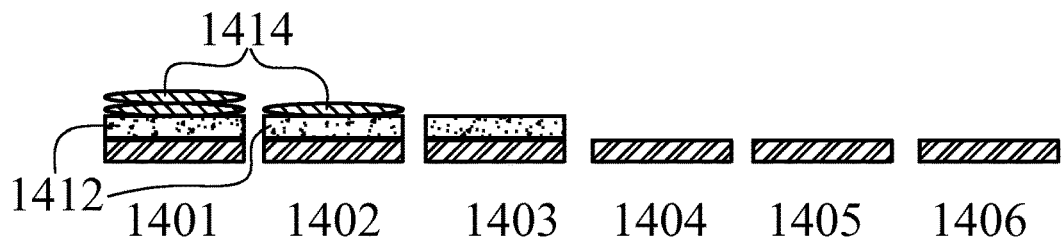
Figure 14E:
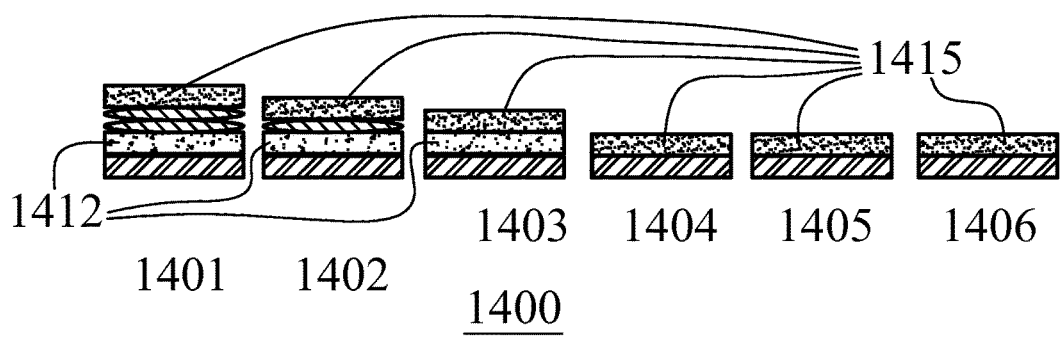
Figure 14F:
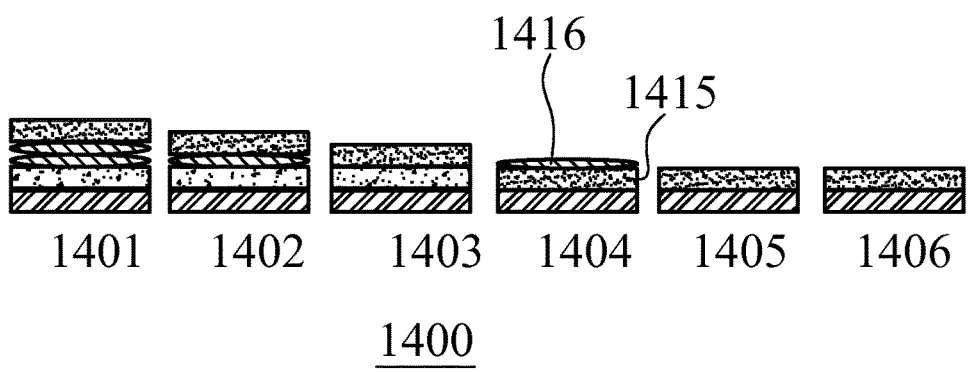
Figure 14G:
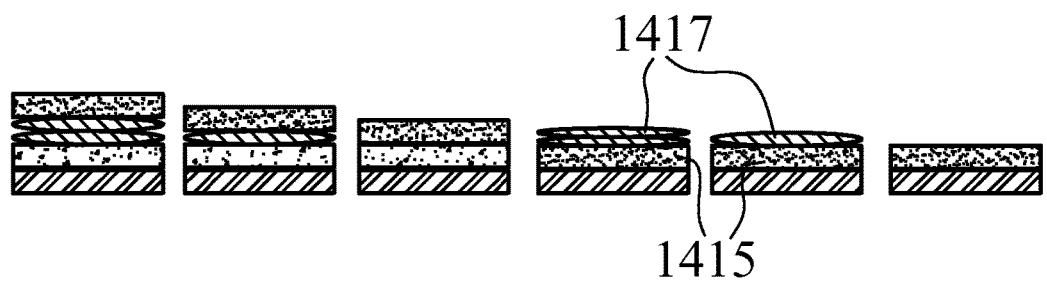
Figure 14H:
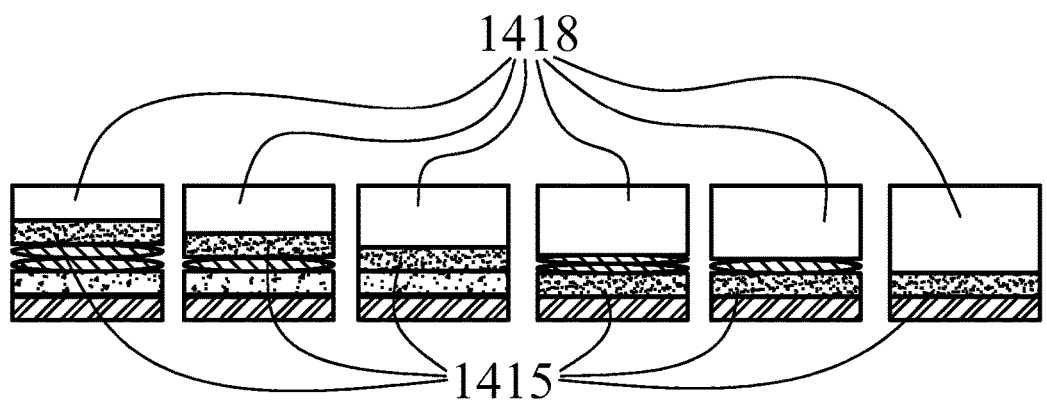

In FIG. 14a, for the transistors 1401-1406, a first p-type metal layer 1411 is formed over a channel layer (not shown). In FIG. 14b, for the transistor 1401-1403, a first n-type metal layer 1412 is formed. In FIG. 14c, for the transistor 1401, a first dopant 1413 is implanted in the first n-type metal layer 1412. In FIG. 14d, for the transistors 1401-1402, a second dopant 1414 is implanted in the first n-type metal layer 1412. In FIG. 14e, for the transistors 1401-1406, a cap metal layer 1415 is formed. In FIG. 14f, for the transistor 1404, a third dopant 1416 is implanted in the cap metal layer 1415. In FIG. 14g, for the transistors 1404-1405, a fourth dopant 1417 is implanted in the cap metal layer 1415. In FIG. 14h, for the transistors 1401-1406, a gate metal layer 1418 is formed over the cap metal layer 1415. As such, the transistors 1401-1406 having six different thresholds are provided.

Figure 15:
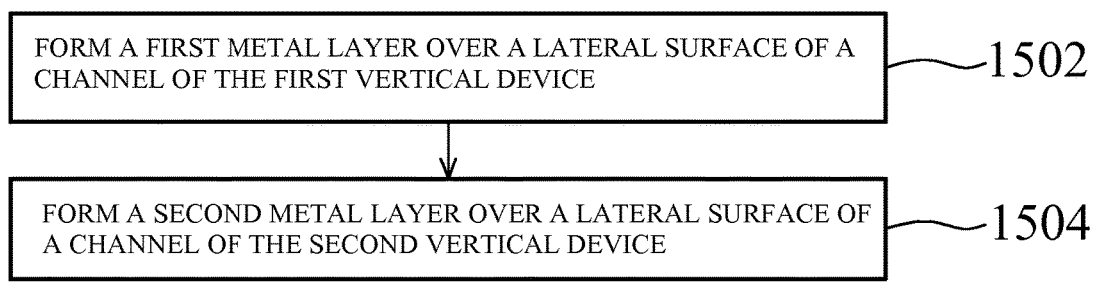
FIG. 15 is a flow chart for manufacturing a chip comprising a first vertical device having a first threshold and a second vertical device having a second threshold according to an exemplary embodiment.

FIG. 15 is a flow chart for manufacturing a chip comprising a first vertical device having a first threshold and a second vertical device having a second threshold according to an exemplary embodiment. As shown in FIG. 15, a method 1500 is provided. The method 1500 includes the following operations: forming a first conductive layer over a lateral surface of a channel of the first vertical device (1502); and forming a second conductive layer over a lateral surface of a channel of the second vertical device (1504).

In the exemplary embodiment, the method 1500 may include: implanting a first dopant at a tilted angle with reference to vertical direction. In the exemplary embodiment, the method 1500 may include: forming a first gate adjacent to the first conductive layer, and forming a second gate adjacent to the second conductive layer. In the exemplary embodiment, the method 1500 may include: forming a third conductive layer over the lateral surface of the channel of the first vertical device.

In the exemplary embodiment, the operation 1502 of forming the first conductive layer over the lateral surface of the channel of the first vertical device further comprises: forming the first conductive layer corresponding to the first threshold, and the operation 1504 of forming the second conductive layer over the lateral surface of the channel of the second vertical device further comprises: forming the second conductive layer corresponding to the second threshold. In the exemplary embodiment, the operation of implanting the first dopant at the tilted angle with the reference of the vertical direction further comprises: implanting the first dopant with 5 to 60 degrees with reference to vertical direction. In the exemplary embodiment, the operation of forming the first conductive layer and the third conductive layer over the lateral surface of the channel of the first vertical device further comprises: forming the first conductive layer and the third conductive layer corresponding to the first threshold, and forming the second conductive layer over the lateral surface of the channel of the second vertical device further comprises: forming the second conductive layer corresponding to the second threshold.

According to an exemplary embodiment, a chip is provided. The chip includes a first vertical device having a first threshold and second vertical device having a second threshold. The first vertical includes: a first source; a first channel over the first source; a first drain over the first channel; a first gate dielectric adjacent to the first channel; a first conductive layer adjacent to the first gate dielectric; and a first gate metal adjacent to the first conductive layer. The second vertical includes: a second source; a second channel over the second source; a second drain over the second channel; a second gate dielectric adjacent to the second channel; a second conductive layer adjacent to the second gate dielectric; and a second gate metal adjacent to the second conductive layer.

According to an exemplary embodiment, a method for manufacturing a chip comprising a first vertical device having a first threshold and a second vertical device having a second threshold is provided. The method includes the following operations: forming a first conductive layer over a lateral surface of a channel of the first vertical device; and forming a second conductive layer over a lateral surface of a channel of the second vertical device.

According to an exemplary embodiment, a chip is provided. The chip includes a first vertical device having a first threshold, second vertical device having a second threshold and a third vertical device having a third threshold. The first vertical includes: a first source; a first channel over the first source; a first drain over the first channel; a first gate dielectric adjacent to the first channel; a first conductive layer adjacent to the first gate dielectric; and a first gate metal adjacent to the first conductive layer. The second vertical includes: a second source; a second channel over the second source; a second drain over the second channel; a second gate dielectric adjacent to the second channel; a second conductive layer adjacent to the second gate dielectric; and a second gate metal adjacent to the second conductive layer. The third vertical device having a third threshold includes: a third source; a third channel over the third source; a third drain over the third channel; a third gate dielectric adjacent to the third channel; a third conductive layer adjacent to the third gate dielectric; and a third gate metal adjacent to the third conductive layer.

In the exemplary embodiment, the first conductive layer corresponds to the first threshold, the second conductive layer corresponds to the second threshold, and the third conductive layer corresponds to the third threshold.

This written description uses examples in the disclosure to: disclose the best mode and also to enable a person ordinarily skilled in the art to make and use the disclosure. The patentable scope may include other examples that occur to those skilled in the art.

One skilled in the relevant art upon reading this disclosure will recognize that the various embodiments may be practiced without one or more of the specific details, or with other replacement and/or additional methods, materials, or components. Well-known structures, materials, or operations may not be shown or described in detail to avoid obscuring aspects of various embodiments. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A chip, comprising:
   a first vertical device having a first threshold voltage, comprising:
   a first source;
   a first channel over the first source;
   a first drain over the first channel;
   a first gate dielectric layer adjacent to a lateral surface of the first channel;
   a first conductive layer comprising a p-type work function metal layer and adjacent the first gate dielectric layer, the p-type work function metal layer being implanted with a first dopant; and
   a first gate metal layer adjacent to the first conductive layer; and
   a second vertical device having a second threshold voltage, comprising:
   a second source;
   a second channel over the second source;
   a second drain over the second channel;
   a second gate dielectric layer adjacent to a lateral surface of the second channel;
   a second conductive layer comprising an n-type work function metal layer adjacent the second gate dielectric layer; and
   a second gate metal layer, wherein:
   the p-type work function metal layer includes TiN or TaN, which further comprises Te, Re, Rh, Be, or Co,
   the n-type work function metal layer includes TiN, TiAl, or TaN, which further comprises Mn, Zr, Pb, or Sn, and
   the first conductive layer provides the first threshold voltage different from the second threshold voltage that the second conductive layer provides,
   the first conductive layer further comprises a layer made of the n-type work function metal and disposed between the p-type work function metal layer and the first gate metal layer, and
   the second conductive layer does not include the p-type work function metal layer.

2. The chip of claim 1, wherein the first vertical device is used for at least one of an SRAM block, an I/O logic block, a function logic block, an embedded DRAM block and a flash block.

3. The chip of claim 1, wherein:
   the first conductive layer and the second conductive layer are formed of a first material,
   the second conductive layer is implanted with a second dopant, and
   the second conductive layer implanted with the second dopant in part provides the second threshold voltage different from the first threshold voltage that the first conductive layer provides.

4. The chip of claim 1, wherein:
   the first conductive layer and the second conductive layer are formed of a first material,
   the first conductive layer is implanted with the first dopant with a first concentration, and
   the second conductive layer is implanted with the first dopant with a second concentration, and
   the second conductive layer implanted with the first dopant with a second concentration in part provides the second threshold voltage different from the first threshold voltage that the first conductive layer provides.

5. The chip of claim 1, wherein:
   the first conductive layer and the second conductive layer are formed of a first material,
   the first conductive layer has a first thickness, and the second conductive layer has a second thickness, and
   the second conductive layer having a second thickness in part provides the second threshold voltage different from the first threshold voltage that the first conductive layer provides.

6. The chip of claim 3, wherein the first dopant is selected from the group consisting of Al, Ga, In, Be, Se, and F, and the second dopant is selected from the group consisting of As, Sb, P, Ta, Te, Sn, S, Mo, Sc, and Ge.

7. The chip of claim 1, wherein the first gate dielectric layer and the second gate dielectric layer comprise the same high-K gate dielectric material.

8. The chip of claim 1, wherein the first gate metal layer and the second gate metal layer include W, Co, or Cu.

9. The chip of claim 1, wherein:
the p-type work function metal layer includes TiN or TaN, which further comprises Te, Re, Rh or Be, and
the n-type work function metal layer includes TiN, TiAl, or TaN, which further comprises Mn, Pb, or Sn.

10. A chip, comprising:
a first vertical device having a first threshold voltage, comprising:
a first source;
a first channel over the first source;
a first drain over the first channel;
a first gate dielectric layer adjacent to a lateral surface of the first channel;
a first conductive layer adjacent the first gate dielectric layer and comprising first one or more layers providing in part the first threshold voltage, one of the first one or more layers being implanted with first one or more dopants at first one or more concentrations; and
a first gate metal layer adjacent to the first conductive layer;
a second vertical device having a second threshold voltage, comprising:
a second source;
a second channel over the second source;
a second drain over the second channel;
a second gate dielectric layer adjacent to a lateral surface of the first channel;
a second conductive layer adjacent the second gate dielectric layer and comprising second one or more layers providing in part the second threshold voltage, one of the second one or more layers being implanted with second one or more dopants at second one or more concentrations; and
a second gate metal layer adjacent to the second conductive layer; and
a third vertical device having a third threshold voltage, comprising:
a third source;
a third channel over the third source;
a third drain over the third channel;
a third gate dielectric layer adjacent to a lateral surface of the third channel;
a third conductive layer adjacent the third gate dielectric layer and comprising third one or more layers providing in part the third threshold voltage; and
a third gate metal layer adjacent to the third conductive layer, wherein:
a total number of the first one or more layers, a total number of the second one or more layers and a total number of third one or more layers are different from each other,
the first threshold voltage, the second threshold voltage, and the third threshold voltage are different, and
one of the first one or more layers includes a metal layer including TiN or TaN, which further comprises Te, Re, Rh, Be, or Co, and one of the second one or more layers includes a metal layer including TiN, TiAl, or TaN, which further comprises Mn, Zr, Pb, or Sn.

11. The chip of claim 10, wherein the one of the first one or more layers includes the metal layer including TiN or TaN, which further comprises Te, Re, Rh or Be, and the one of the second one or more layers includes the metal layer including TiN, TiAl, or TaN, which further comprises Mn, Pb, or Sn.

12. A method for manufacturing a chip comprising a first vertical device having a first threshold voltage and a second vertical device having a second threshold voltage different from the first threshold voltage, comprising:
forming a first conductive layer adjacent to a lateral surface of a channel of the first vertical device and adjacent to a lateral surface of a channel of the second vertical device, the first conductive layer comprising TiN or TaN, which further comprising Te, Re, Rh, Be, or Co;
removing the first conductive layer formed adjacent to the lateral surface of the channel of the second vertical device, while maintaining the first conductive layer formed adjacent to the lateral surface of the channel of the first vertical device;
forming a second conductive layer adjacent to the lateral surface of the channel of the second vertical device, from which the first conductive layer is removed, and over the first conductive layer over the first vertical device, the second conductive layer comprising TiN, TiAl or TaN, which further comprising Mn, Zr, Pb, or Sn;
implanting in either the first conductive layer comprising TiN or TaN or the second conductive layer comprising TiN, TiAl or TaN, a first dopant at a tilted angle with reference to a vertical direction perpendicular to a normal to the lateral surface of the channel; and
forming a gap in the second conductive layer that separates the second conductive layer over the first conductive layer from the second conductive layer adjacent to the lateral surface of the channel of the second vertical structure,
wherein the second conductive layer over the first conductive layer provides the first threshold voltage different from the second threshold voltage that the second conductive layer provides.

13. The method of claim 12, wherein in the implanting the first dopant at the tilted angle with the reference of the vertical direction, the first dopant is implanted with 5 to 60 degrees with reference to the vertical direction.

14. The method of claim 12, further comprising: forming a first gate metal adjacent to the first conductive layer, and forming a second gate metal adjacent to the second conductive layer.

15. The method of claim 12, further comprising: forming a third conductive layer over the second conductive layer.

16. The method of claim 12, wherein the first dopant is implanted by an implantation energy in a range from 100 eV to 25 keV at a concentration in a range from $10^{13}$ ions/cm$^2$ to $10^{16}$ ions/cm$^2$.

17. The method of claim 12, wherein:
the first conductive layer includes TiN or TaN, which further comprises Te, Re, Rh or Be, and
the second conductive layer includes TiN, TiAl, or TaN, which further comprises Mn, Pb, or Sn.

* * * * *